(12) United States Patent
Feichtinger et al.

(10) Patent No.: US 9,337,408 B2
(45) Date of Patent: May 10, 2016

(54) LIGHT-EMITTING DIODE DEVICE

(71) Applicant: EPCOS AG, Munich (DE)

(72) Inventors: Thomas Feichtinger, Graz (AT); Sebastian Brunner, Graz (AT); Oliver Dernovsek, Lieboch (AT); Klaus-Dieter Aichholzer, Deutschlandsberg (AT); Georg Krenn, Graz (AT); Axel Pecina, St. Martin (AT); Christian Faistauer, Frauental (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/422,673

(22) PCT Filed: Jul. 22, 2013

(86) PCT No.: PCT/EP2013/065439
§ 371 (c)(1),
(2) Date: Feb. 19, 2015

(87) PCT Pub. No.: WO2014/032859
PCT Pub. Date: Mar. 6, 2014

(65) Prior Publication Data
US 2015/0243865 A1    Aug. 27, 2015

(30) Foreign Application Priority Data
Aug. 31, 2012    (DE) .......................... 10 2012 108 107

(51) Int. Cl.
*H01L 33/64*    (2010.01)
(52) U.S. Cl.
CPC ............ *H01L 33/644* (2013.01); *H01L 33/642* (2013.01); *H01L 33/647* (2013.01)

(58) Field of Classification Search
None
See application file for complete search history.

(56) References Cited

U.S. PATENT DOCUMENTS

| | | | | |
|---|---|---|---|---|
| 5,731,067 | A * | 3/1998 | Asai et al. ..................... | 428/210 |
| 2003/0189830 | A1 * | 10/2003 | Sugimoto et al. ............. | 362/294 |
| 2004/0222433 | A1 | 11/2004 | Mazzochette et al. | |
| 2007/0200133 | A1 | 8/2007 | Hashimoto et al. | |
| 2008/0043444 | A1 | 2/2008 | Hasegawa et al. | |
| 2008/0224816 | A1 | 9/2008 | Inoue et al. | |
| 2008/0303157 | A1 | 12/2008 | Cheng et al. | |
| 2009/0250709 | A1 | 10/2009 | Chang et al. | |
| 2011/0127912 | A1 | 6/2011 | Lee et al. | |
| 2011/0261536 | A1 | 10/2011 | Feichtinger et al. | |
| 2012/0181696 | A1 | 7/2012 | Sun | |

FOREIGN PATENT DOCUMENTS

| | | |
|---|---|---|
| DE | 102008024480 A1 | 12/2009 |
| EP | 2597691 A1 | 5/2013 |
| JP | 200666630 A | 3/2006 |
| JP | 2006156447 A | 6/2006 |
| JP | 2008270325 A | 11/2008 |
| JP | 2011524082 A | 8/2011 |
| WO | 2007058438 A1 | 5/2007 |
| WO | WO2012011562 A1 | 1/2012 |

* cited by examiner

*Primary Examiner* — Scott B Geyer
(74) *Attorney, Agent, or Firm* — Slater Matsil, LLP

(57) ABSTRACT

A light-emitting diode device has a first carrier and at least one light-emitting diode chip, which is arranged on the first carrier. The first carrier has at least one first and one second carrier part, wherein the light-emitting diode chip rests only on the first carrier part. Furthermore, the first and second carrier parts each have a thermal conductivity. The thermal conductivity of the first carrier part is at least 1.5 times the thermal conductivity of the second carrier part. The first carrier part is surrounded laterally by the second carrier part.

20 Claims, 4 Drawing Sheets

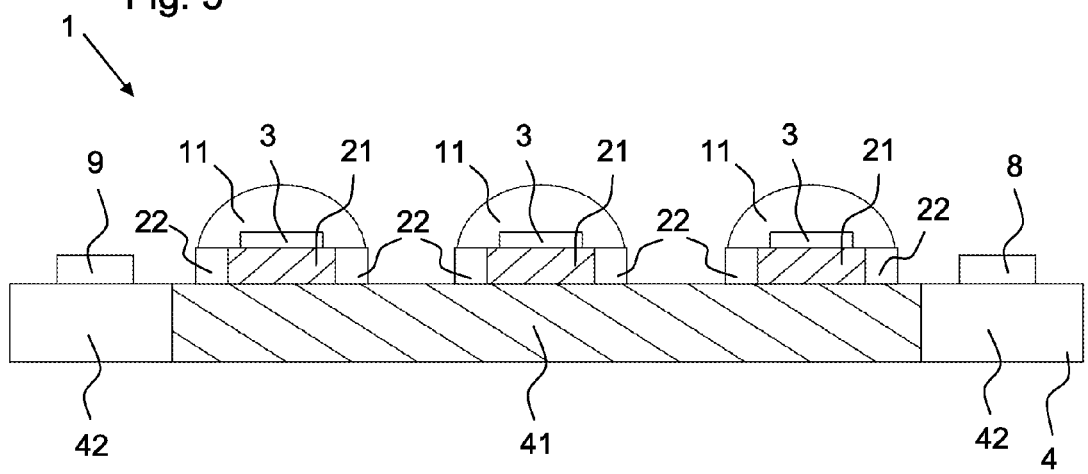
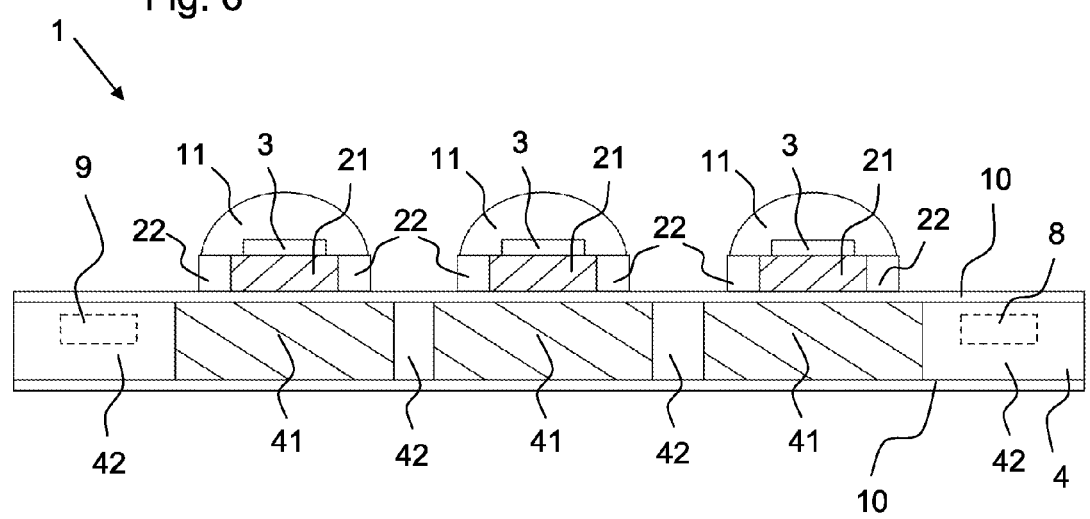

LIGHT-EMITTING DIODE DEVICE

This patent application is a national phase filing under section 371 of PCT/EP2013/065439, filed Jul. 22, 2013, which claims the priority of German patent application 10 2012 108 107.7, filed Aug. 31, 2012, each of which is incorporated herein by reference in its entirety.

TECHNICAL FIELD

A light-emitting diode device is specified which has at least one carrier and a light-emitting diode chip arranged on the carrier.

BACKGROUND

Luminous efficacy, life-time and thermal management play an ever greater role in the design of systems with light-emitting diodes (LEDs). In addition to functional challenges, it is also necessary to solve thermomechanical and geometric problems. The LED and discrete protection components should have as low a physical height as possible and take up as little space as possible, in particular in mobile applications, for example, for an integrated LED camera flash lamp in smart phones or digital cameras. A further important demand placed on the housing solution consists in that the LED for the emission of light is, as far as possible, free from other components and that there is no shadowing owing to the protection components.

SUMMARY

At least some embodiments specify a light-emitting diode device.

A light-emitting diode device in accordance with at least one embodiment has a first carrier. The first carrier can comprise, for example, a ceramic material, such as aluminum oxide or aluminum nitride, for example, an organic material, such as a polymer or an epoxy resin, for example, and/or a metallic material, such as aluminum or copper, for example.

The light-emitting diode device furthermore has at least one light-emitting diode chip, which is arranged on the first carrier. For example, the light-emitting diode chip can comprise at least one of the following materials: gallium phosphide (GaP), gallium nitride (GaN), gallium arsenide phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium nitride (AlGaN), aluminum gallium indium nitride (AlGaInN), zinc selenide (ZnSe).

In accordance with a further embodiment, the light-emitting diode chip has at least two contact areas. Preferably, the contact areas can be soldered. For example, the contact areas comprise an alloy or a layer sequence with one of the following material combinations or consist thereof: Cu/Ni/Au, Cr/Ni/Au, Cr/Cu/Ni/Au, Cu/Ni/Sn, Cr/Ni/Sn, Cr/Cu/Ni/Sn.

In accordance with a further embodiment, the first carrier has at least one first and one second carrier part. Preferably, the first carrier part and the second carrier part adjoin one another. For example, the first carrier part of the first carrier can be surrounded laterally by the second carrier part of the first carrier. This can mean in particular that the first carrier part is surrounded laterally completely by the second carrier part, wherein laterally can mean a direction perpendicular to the direction of arrangement of the light-emitting diode chip on the first carrier. The first carrier part can in this case in particular also protrude through the second carrier part and therefore form a surface or part of a surface of the first carrier on a side facing the light-emitting diode chip and a side facing away from the light-emitting diode chip. The first and second carrier parts can form a carrier body of the first carrier, for example. The first carrier can furthermore have connection elements for making electrical contact with the light-emitting diode chip, such as, for example, conductor tracks, connection areas or further electrical contact elements. The first and second carrier parts each have a thermal conductivity, wherein the thermal conductivities of the first and second carrier parts are preferably different than one another.

Particularly preferably, the light-emitting diode chip rests only on the first carrier part of the first carrier. This can mean in particular that, when viewed in a plan view onto the first carrier from the light-emitting diode chip, the light-emitting diode chip is arranged only on the first carrier part. The term "rest" can mean a direct or indirect arrangement of the light-emitting diode chip on the first carrier part here and in the text which follows. Therefore, one or more connection elements and/or one or more connecting layers for mounting the light-emitting diode chip on the first carrier part can also be arranged between the first carrier part and the light-emitting diode chip resting thereon.

In accordance with a preferred embodiment, the first carrier part of the first carrier has a higher thermal conductivity than the second carrier part of the first carrier.

In accordance with a preferred embodiment, the thermal conductivity of the first carrier part is at least 1.5 times the thermal conductivity of the second carrier part. Heat can be dissipated particularly effectively from the light-emitting diode chip, for example, in the direction of a housing of the light-emitting diode device, with which the first carrier part is preferably in good thermal contact, by means of the first carrier part, on which the light-emitting diode chip is arranged and which has a high thermal conductivity in comparison with the second carrier part.

In accordance with a particularly preferred embodiment, the light-emitting diode device has a first carrier and at least one light-emitting diode chip, which is arranged on the first carrier. The first carrier has at least one first and one second carrier part, wherein the light-emitting diode chip rests only on the first carrier part of the first carrier, and the first carrier part of the first carrier is surrounded laterally by the second carrier part of the first carrier. The first and second carrier parts each have a thermal conductivity, wherein the thermal conductivity of the first carrier part is at least 1.5 times the thermal conductivity of the second carrier part.

In accordance with a further particularly preferred embodiment, the thermal conductivity of the first carrier part is at least five times the thermal conductivity of the second carrier part. As a result, a particularly large amount of heat can be conducted away from the light-emitting diode chip. For example, the second carrier part can contain aluminum oxide and have a thermal conductivity of approximately 25 W/mK, and the first carrier part can contain silver with a glass or ceramic filler and have a thermal conductivity of approximately 150 W/mK.

In accordance with a further embodiment, the light-emitting diode device has a second carrier, on which the first carrier is arranged. The second carrier has at least one first and one second carrier part. The first carrier part of the second carrier and the second carrier part of the second carrier each have a thermal conductivity, wherein the thermal conductivities of the first and second carrier parts of the second carrier are preferably different than one another. Preferably, the first carrier part of the second carrier has a higher thermal conductivity than the second carrier part of the second carrier. The first carrier part of the second carrier is surrounded laterally by the second carrier part of the second carrier.

In accordance with a further embodiment, the first carrier parts of the first and second carriers are arranged one above the other. This can mean in particular that the first carrier is arranged on the second carrier in such a way that the first carrier part of the first carrier is arranged on the first carrier part of the second carrier. By virtue of such an arrangement, particularly effective heat dissipation away from the light-emitting diode chip can be achieved.

In accordance with a further preferred embodiment, the light-emitting diode device has a first carrier, on which at least one light-emitting diode chip is arranged, and a second carrier, on which the first carrier is arranged. The first and second carriers each have a first and second carrier part, wherein the light-emitting diode chip preferably rests only on the first carrier part of the first carrier. The first and second carrier parts each have a thermal conductivity. Preferably, the first carrier part of the first carrier has a higher thermal conductivity than the second carrier part of the first carrier, and the first carrier part of the second carrier has a higher thermal conductivity than the second carrier part of the second carrier. Furthermore, the first carrier parts are preferably arranged one above the other, wherein the first carrier part of the first carrier is surrounded laterally by the second carrier part of the first carrier and the first carrier part of the second carrier is surrounded laterally by the second carrier part of the second carrier.

In accordance with a further embodiment, the thermal conductivity of the first carrier part of the second carrier is at least 1.5 times the thermal conductivity of the second carrier part of the second carrier. In accordance with a further preferred embodiment, the thermal conductivity of the first carrier part of the second carrier is at least 5 times the thermal conductivity of the second carrier part of the second carrier.

In accordance with a further embodiment, the second carrier part of the first and/or second carrier(s) comprises a ceramic material, such as aluminum oxide or aluminum nitride, for example, an organic material, such as a polymer or epoxy resin, for example, or a metallic material, such as aluminum or copper, for example. Furthermore, it is possible for the second carrier part of the first and/or second carrier(s) to consist of one of the abovementioned materials. In this case, the second carrier part of the first carrier and the second carrier part of the second carrier can comprise identical or different materials or consist of identical or different materials.

In accordance with a further embodiment, the first and/or second carrier(s) comprise(s) a metallic material, wherein the metallic material is provided with an electrically insulating layer. Electrical insulation between the first and second carriers or between one of the carriers and a component arranged thereon, for example, can be achieved by means of the electrically insulating layer. Preferably, the electrically insulating layer comprises one of the following materials or consists of one of the following materials: titanium oxide, aluminum oxide, aluminum nitride, silicon oxide, silicon nitride.

In accordance with a further embodiment, the first carrier has a first surface, on which the light-emitting diode chip is arranged, and a second surface, which is opposite the first surface. Preferably, the first carrier part of the first carrier extends from the first to the second surface. As a result, particularly efficient heat dissipation away from the light-emitting diode chip can be achieved.

In accordance with a further embodiment, the second carrier has a surface, on which the first carrier is arranged, and a second surface, which is opposite the first surface of the second carrier. Preferably, the first carrier part of the second carrier extends from the first to the second surface of the second carrier.

In accordance with a further embodiment, the first carrier part of the first carrier has thermal vias, i.e., thermally conductive plated-through holes, which extend from a first surface of the first carrier, on which the light-emitting diode chip is arranged, to the second surface of the first carrier which is opposite the first surface. In this case, via stands for "vertical interconnect access". The thermal vias can be, for example, metallic vias, i.e., vias filled with a metal. For example, the thermal vias comprise copper, silver or silver-palladium or consist thereof.

In accordance with a further embodiment, the first carrier part of the second carrier has thermal vias. The thermal vias can in this case be embodied as described previously in connection with the thermal vias of the first carrier.

In accordance with a further embodiment, the first carrier part of the first carrier has a metal block or consists of a metal block. The metal block preferably comprises a metal with a high thermal conductivity, such as silver, for example, or consists thereof.

In accordance with a further embodiment, the first carrier part of the second carrier has a metal block or consists of a metal block, wherein the metal block comprises a metal with a high thermal conductivity, such as silver, for example, or consists thereof.

In accordance with a further embodiment, the first carrier part of the first carrier has dopings. The dopings can be, for example, in the form of metal particles which can be embedded in a ceramic material, for example, or in the form of a metallic doping, for example, in a semiconductor material such as silicon or gallium arsenide, for example.

In accordance with a further embodiment, the first carrier part of the second carrier has dopings. The dopings in the first carrier part of the second carrier can be, for example, embodied in the same way as the dopings described previously in connection with the dopings of the first carrier part of the first carrier.

In each case advantageously the thermal conductivity of the first carrier part of the first and/or second carrier(s) can be significantly increased by means of the thermal vias, the metal block and the dopings.

In accordance with a further embodiment, the first carrier has an ESD protection element. In this case, "ESD" stands for "electrostatic discharge" here and in the text which follows. The ESD protection element is used preferably for protecting the light emitting diode chip from overvoltages, in particular from electrostatic discharges. Generally, light emitting diode chips are very sensitive to electrostatic discharges, in particular in the case of those with a voltage value of greater than 100 volts, and therefore need to be protected by protection components. The ESD protection element can be arranged, for example, on the first carrier.

In accordance with a further embodiment, the ESD protection component is in the form of a varistor. The varistor can be, for example, in the form of a multilayer varistor (MLV).

Preferably, the multilayer varistor comprises a varistor ceramic, which can comprise, for example, a system consisting of ZnO—Pr, ZnO—Bi—Sb, $SrTiO_3$ or SiC or consist thereof. Furthermore, it is possible for the ESD protection component to be in the form of a suppressor diode, in particular a silicon semiconductor protective diode, or in the form of a polymer ESD protection element, i.e., a polymer-based ESD protection element, in which a semiconductive material is embedded in a polymer, for example.

In accordance with a further embodiment, the second carrier has an ESD protection element. The ESD protection element can be arranged, for example, on the second carrier. The ESD protection element can in this case be embodied in particular as an ESD protection element described in connection with the first carrier.

In accordance with a further embodiment, the ESD protection element is formed by a subregion of the first and/or second carrier(s). Particularly preferably, the ESD protection element can be a protective structure which is integrated in the first and/or second carrier(s). In other words, the ESD protection element is in this case not mounted on the carriers as a discrete component, for example, in the form of a discrete ESD protection diode. In this case, it may be that the ESD protection element comprises a material, for example, a ceramic varistor material, which the first and/or second carrier(s) also comprise(s). Alternatively, it is possible for the ESD protection element to comprise a material which is different than the material or the materials of the first and/or second carrier(s). For example, the ESD protection element can comprise a semiconductive material, for example, a ceramic varistor material, which is embedded in the first and/or second carrier(s), which comprises aluminum oxide, aluminum nitride or an organic material, for example.

For example, the ESD protection element formed by a subregion of the first or second carrier can comprise a varistor ceramic and a plurality of mutually overlapping inner electrodes. Alternatively, it is also conceivable for the ESD protection element to be formed by a semiconductor diode integrated in the carrier.

By virtue of the fact that the ESD protection element is formed by a subregion of the first and/or second carrier(s) of the light-emitting diode device, a particularly compact design of a light-emitting diode device described here can advantageously be achieved.

In accordance with a further embodiment, the light-emitting diode device has a thermistor component, which can be arranged on the first or second carrier. For example, the thermistor component can be in the form of an ultra-thin protection component. This can mean in particular that the electrical component can have a physical height of less than or equal to 150 μm. Furthermore, the thermistor component can be embedded in the first and/or second carrier(s), for example, in the second carrier part of the first and/or second carrier(s).

In accordance with a further embodiment, the thermistor component is in the form of an NTC thermistor component, where "NTC" stands for "negative temperature coefficient". An NTC thermistor component is characterized by the fact that current is conducted better at high temperatures than at low temperatures. Therefore, the NTC thermistor component can also be referred to as a hot conductor in German.

Preferably, the NTC thermistor component acts as thermal sensor. The thermal sensor is preferably interconnected with the light-emitting diode chip. For example, the thermal sensor can contribute to the regulation of a control current of the light-emitting diode chip so that said light-emitting diode chip can be operated in a protected manner. As a result, the life of the light-emitting diode chip can advantageously be extended.

In accordance with a further embodiment, the thermistor component is in the form of a PTC thermistor component, wherein "PTC" stands for "positive temperature coefficient". The PTC thermistor component is preferably interconnected with the light-emitting diode chip. In the case of a PTC thermistor component, current is conducted better at low temperatures than at high temperatures, for which reason PTC thermistor components are also referred to as cold conductors in German. Preferably, the PTC thermistor component acts as overcurrent protection element and protects the light-emitting diode chip from excessively high operating currents, as a result of which the life of the light-emitting diode chip can be extended.

In accordance with a further embodiment, the light-emitting diode device has a third carrier. Preferably, the second carrier is arranged with a side facing away from the first carrier on the third carrier. The third carrier can likewise have a first carrier part and a second carrier part, which surrounds the first carrier part laterally, wherein the first carrier part preferably has a higher thermal conductivity than the second carrier part. The third carrier can have further features, which have been described in connection with the second carrier.

In accordance with a further embodiment, the light-emitting diode chip is at least partially surrounded by a protective coating. The protective coating can act as lens of the light-emitting diode device, for example. Preferably, the protective coating comprises silicone or consist of silicone.

The light-emitting diode device described here can advantageously be operated at a high temperature and power with a high luminous efficacy without the life of the light-emitting diode chip being negatively influenced.

BRIEF DESCRIPTION OF THE DRAWINGS

Further advantages and advantageous embodiments of the light-emitting diode device result from the embodiments described below in connection with FIGS. 1 to 9, in which:

FIGS. 4 to 6 show schematic sectional views of light-emitting diode devices in accordance with further exemplary embodiments, which each have at least one first and one second carrier and a light-emitting diode chip.

Identical or functionally identical component parts may each have been provided with the same reference symbols in the exemplary embodiments and figures. The elements illustrated and the size ratios thereof in relation to one another should in principle not be considered as being true to scale. Instead, individual elements, such as layers, component parts and regions, for example, can have been represented as being excessively thick or having excessively large dimensions for improved clarity and/or better understanding.

DETAILED DESCRIPTION OF ILLUSTRATIVE EMBODIMENTS

Figure 1:
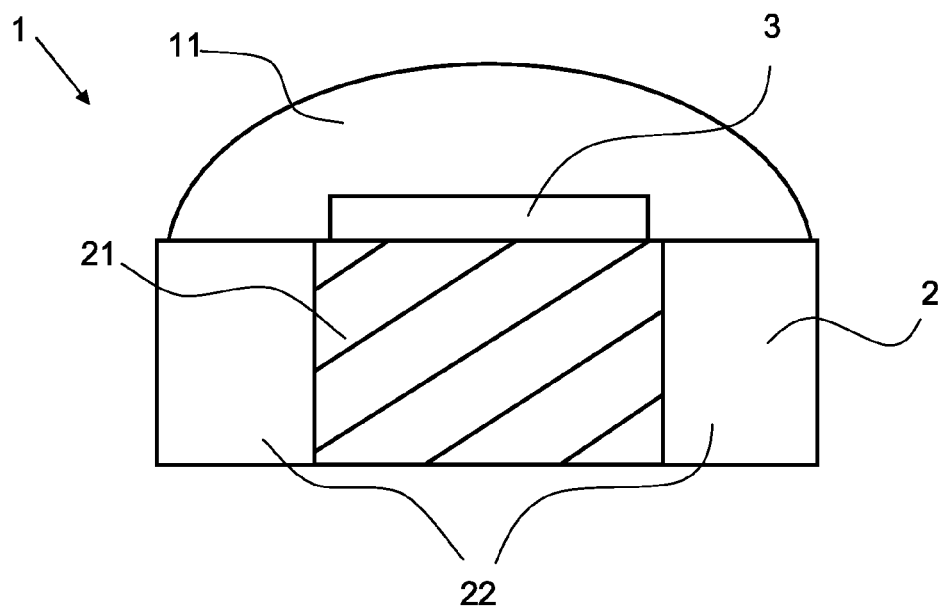
FIGS. 1 to 3 show schematic sectional views of light-emitting diode devices in accordance with some exemplary embodiments, which each have a first carrier and at least one light-emitting diode chip.

FIG. 1 shows a schematic sectional view of a light-emitting diode device 1 in accordance with a first exemplary embodiment. The light-emitting diode device 1 comprises a first carrier 2, which has a first carrier part 21 and a second carrier part 22. The first carrier part 21 in this case extends from a first surface of the first carrier 2 to a second surface, which is opposite the first surface, of the first carrier 2 and is surrounded laterally by the second carrier part 22. The first and second carrier parts 21, 22 comprise an electrically insulating material, in particular a ceramic material.

Furthermore, the light-emitting diode device 1 has a light-emitting diode chip 3, which is arranged on the first carrier 2 and in particular rests only on the first carrier part 21. The light-emitting diode chip 3 has contact areas (not shown), which serve to make contact with and/or for fitting of the light-emitting diode chip 3. For example, the contact areas of the light-emitting diode chip 3 are soldered to the first carrier 2. In particular, the first and second carrier parts 21, 22 form a carrier body of the carrier 2, wherein the carrier 2 can furthermore have, in addition to the carrier parts 21, 22, connection elements for making electrical contact with the light-emitting diode chip 3, such as conductor tracks or connection areas, for example, which are in electrical contact with the contact areas of the light-emitting diode chip (not shown). One or more connecting layers can also be arranged, for example, between the light-emitting diode chip 3 and the first carrier part 21.

The contact areas of the light-emitting diode chip 3 comprise a gold-tin alloy. Alternatively, the contact areas can comprise, for example, copper, nickel or gold or an alloy or layer sequence consisting of at least two of these materials.

Furthermore, the light-emitting diode chip 3 is surrounded by a protective coating 11. The protective coating 11 comprises silicone and acts as lens. For example, the protective coating 11 can be in the form of a wavelength conversion layer.

The first carrier part 21 and the second carrier part 22 each have a thermal conductivity, wherein the thermal conductivity of the first carrier part 21 is greater than the thermal conductivity of the second carrier part 22. In particular, in the exemplary embodiment shown, the thermal conductivity of the first carrier part 21 is 1.5 times the thermal conductivity of the second carrier part 22. The first carrier part 21 can have, for example, vias, dopings or a metal block, as is illustrated and explained by way of example below in connection with FIGS. 7 to 9.

Figure 2:
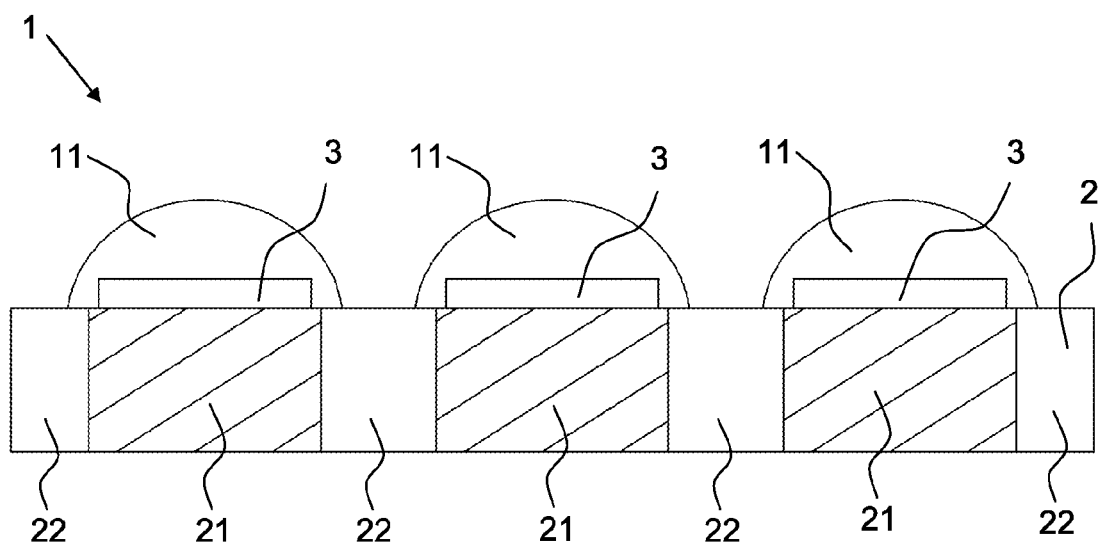

FIG. 2 shows a schematic sectional view of a light-emitting diode device 1 in accordance with a further exemplary embodiment. In contrast to the exemplary embodiment shown in FIG. 1, the first carrier 2 has a multiplicity of first carrier parts 21, which are each surrounded laterally by the second carrier part 22. Furthermore, the light-emitting diode device 1 has a multiplicity of light-emitting diode chips 3, wherein in each case one light-emitting diode chip 3 rests on a first carrier part 21. The first carrier parts 21 each extend from a first surface of the first carrier 2 to a second surface, which is opposite the first surface, of the first carrier 2.

Figure 3:
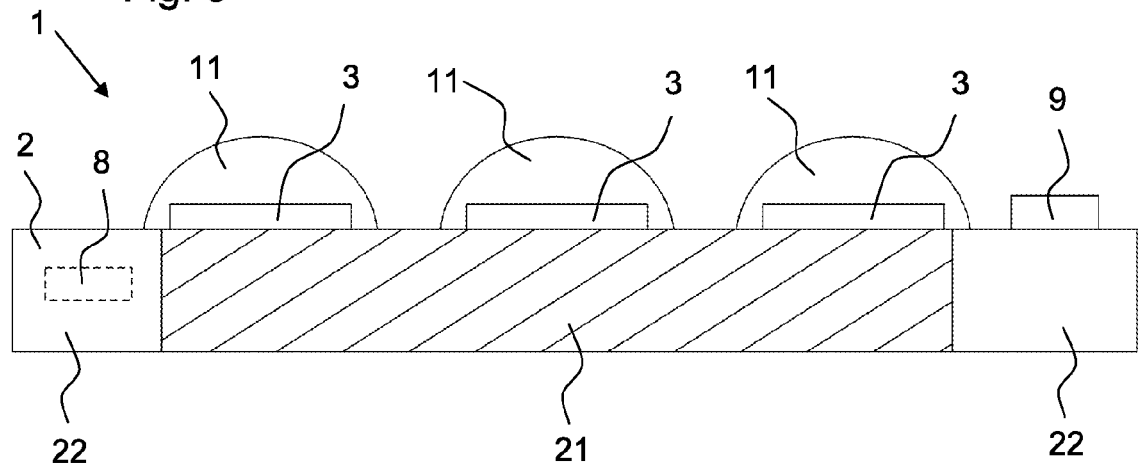

FIG. 3 shows a light-emitting diode device 1 in accordance with a further exemplary embodiment. In contrast to the exemplary embodiment shown in FIG. 2, the first carrier 2 has only one first carrier part 21, which is surrounded laterally by the second carrier part 22. The light-emitting diode chips 3 are all arranged on the first carrier part 21.

Furthermore, the light-emitting diode device 1 has an ESD protection element 8, which is in the form of a varistor and is formed by a subregion of the first carrier 2, in particular by a subregion of the second carrier part 22. Furthermore, the light-emitting diode device 1 comprises a thermistor element 9, which is in the form of an NTC thermistor component and acts as thermal sensor. Alternatively, the thermistor component 9 can also be in the form of a PTC thermistor component.

Figure 4:
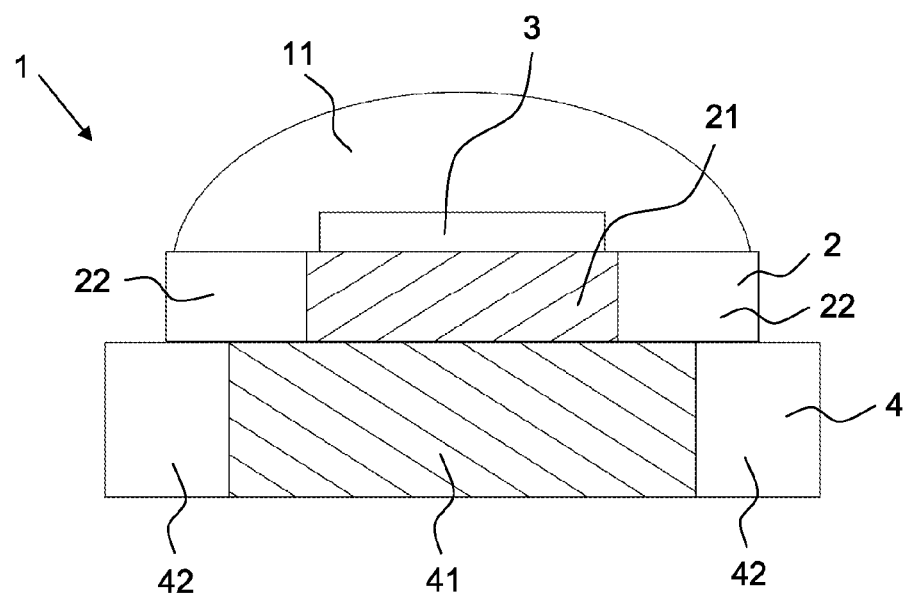

FIG. 4 shows a light-emitting diode device 1 in accordance with a further exemplary embodiment. In contrast to the exemplary embodiment shown in FIG. 1, the light-emitting diode device 1 additionally has a second carrier 4, wherein the first carrier 2 is arranged on the second carrier 4. The second carrier 4 comprises a first carrier part 41 and a second carrier part 42, wherein the second carrier part 42 surrounds the first carrier part 41 laterally. The first carrier part 41 of the second carrier 4 and the second carrier part 42 of the second carrier 4 each have a thermal conductivity, wherein the first carrier part 41 of the second carrier 4 has a higher thermal conductivity than the second carrier part 42 of the second carrier 4.

The first carrier part 41 of the second carrier 4 can be in the form of, for example, a first carrier part, as described in connection with FIGS. 7 to 9. The first carrier part 21 of the first carrier is arranged directly on the first carrier part 41 of the second carrier 4. As a result, advantageously a particularly large amount of heat can be dissipated from the light-emitting diode chip 3 in the direction of the second carrier 4.

FIG. 5 shows a light-emitting diode device 1 in accordance with a further exemplary embodiment. In contrast to the exemplary embodiment shown in FIG. 4, the light-emitting diode device 1 has a plurality of first carriers 2, wherein the first carriers 2 are each arranged on the second carrier 4, in particular on the first carrier part 41 of the second carrier 4. The first carriers 2 each have a first carrier part 21, a second carrier part 22 and a light-emitting diode chip 3 arranged on the first carrier part 21. Furthermore, the light-emitting diode device 1 has an ESD protection component 8 and a thermistor component 9, which are each in the form of discrete components and are arranged on the second carrier 4. Alternatively, the light-emitting diode device 1 can also have a plurality of ESD protection components 8 and thermistor components 9, which are each arranged on the first carriers 2.

FIG. 6 shows a light-emitting diode device 1 in accordance with a further exemplary embodiment. In contrast to the exemplary embodiment shown in FIG. 5, the second carrier 4 has a multiplicity of first carrier parts 41, which are each surrounded laterally by the second carrier part 42 of the second carrier 4. In this case, in each case one first carrier 2 is arranged on each first carrier part 41 of the second carrier 4. In particular, each first carrier part 21 of the first carrier 2 is arranged in each case on a first carrier part 41 of the second carrier 4. As a result, particularly good heat dissipation away from the individual light-emitting diode chips 1 can be achieved.

The light-emitting diode device 1 furthermore has an ESD protection component 8 and a thermistor component 9, which are each embedded in the second carrier part 42 of the second carrier 4, as a result of which, advantageously, the physical height of the light-emitting diode device 1 can be reduced. The first and second carrier parts 41, 42 of the second carrier 4 each comprise a metal. The second carrier 4 furthermore has two electrically insulating layers 10, which are arranged on two opposite sides of the second carrier 4. In this case, the electrically insulating layer 10, which faces the first carrier 2, acts as electrical insulation between the first and second carriers 2, 4. The layer 10 which faces away from the first carrier 2 can serve as electrical insulation between the second carrier 4 and a third carrier (not shown), on which the second carrier 4 can be arranged. The electrically insulating layer 10 comprises aluminum oxide. Alternatively, the electrically insulating layer 10 can also comprise at least one of the following materials: aluminum nitride, titanium oxide, silicon oxide, silicon nitride.

Figure 7:
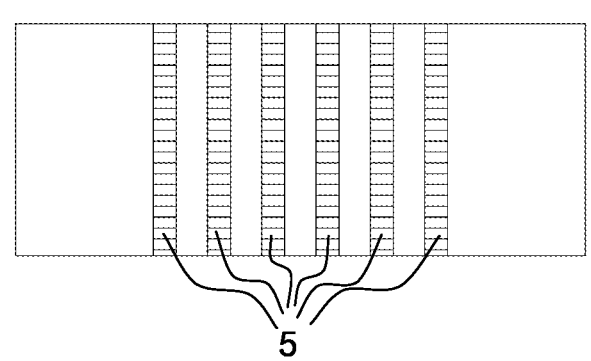
FIGS. 7 to 9 show schematic illustrations of a first carrier part in accordance with further exemplary embodiments.

FIG. 7 shows a schematic illustration of a first carrier part 21 of the first carrier 2 or of a first carrier part 41 of the second carrier 4. The first carrier part 21, 41 comprises a multiplicity of metallic vias 5, which run substantially parallel to one another from a first side of the first carrier part 21, 41 to an opposite second side of the first carrier part 21, 41 and which are filled with silver. Alternatively, the vias 5 can also be filled with one or more other metals, which preferably have a high thermal conductivity. The vias 5 are surrounded, for example, by a ceramic, a polymer or an epoxy resin.

Figure 8:
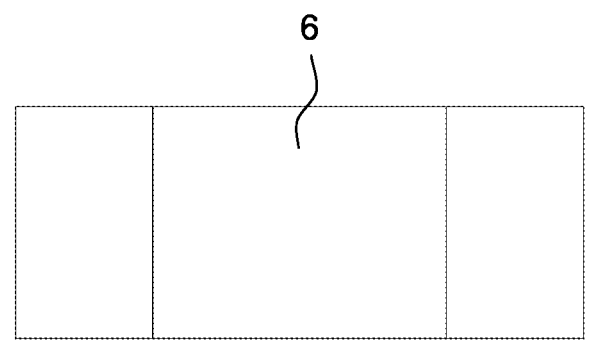

FIG. 8 shows a schematic illustration of a first carrier part 21, 41 in accordance with a further exemplary embodiment.

The first carrier part 21, 41 comprises a silver-comprising metal block 6, which is surrounded laterally by ceramic material. Alternatively, the metal block 6 can also consist of silver or comprise another metal with a preferably high thermal conductivity or consist thereof. Furthermore, it is possible for the metal block 6 to be surrounded laterally by one or more other materials, which preferably differ from the material of the metal block 6, such as a polymer or epoxy resin, for example.

Figure 9:
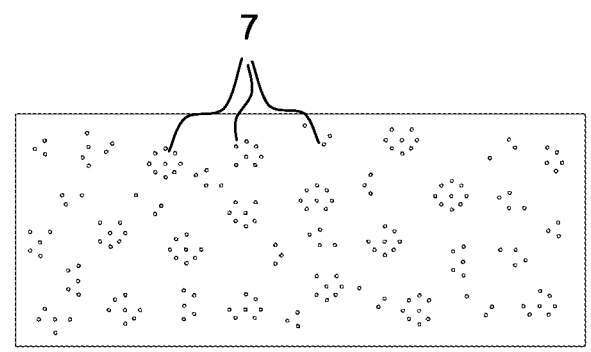

FIG. 9 shows a first carrier part 21, 41 in accordance with a further exemplary embodiment. The first carrier part 21, 41 has dopings 7. The dopings 7 are in the form of a multiplicity of metal particles, which are embedded in a ceramic material. Alternatively, the dopings 7 may also be metal dopings in a semiconductor material, such as Si or GaAs, for example.

By means of the exemplary embodiments of first carrier parts 21, 41 shown in FIGS. 7, 8 and 9, the thermal conductivity of the first carrier part 21, 41 can be significantly increased. As a result, advantageously improved heat dissipation away from the light-emitting diode chip 1 can be achieved.

The features described in the exemplary embodiments shown can, in accordance with further exemplary embodiments, also be combined with one another, even if such combinations are not explicitly shown in the Figures. Furthermore, the light-emitting diode devices shown can have further or alternative features in accordance with the embodiments described above in the general part.

The description on the basis of the exemplary embodiments does not in any way restrict the invention to these exemplary embodiments, but rather the invention includes any novel feature and any combination of features. This includes in particular any combination of features in the patent claims, even if this feature or this combination is itself not explicitly mentioned in the patent claims or exemplary embodiments.

The invention claimed is:

1. A light emitting diode device comprising:
a first carrier; and
a light-emitting diode chip arranged on the first carrier;
wherein the first carrier has a first carrier part and a second carrier part;
wherein the light emitting diode chip rests only on the first carrier part of the first carrier;
wherein the first and second carrier parts each have a thermal conductivity;
wherein the thermal conductivity of the first carrier part is at least 1.5 times the thermal conductivity of the second carrier part;
wherein the first carrier part is surrounded laterally by the second carrier part; and
wherein the light emitting diode device has a plurality of light emitting diode chips that are all arranged on the first carrier part.

2. The light emitting diode device according to claim 1, wherein the thermal conductivity of the first carrier part is at least five times the thermal conductivity of the second carrier part.

3. The light emitting diode device according to claim 1, further comprising a second carrier that comprises a first carrier part and a second carrier part;
wherein the first and second carrier parts of the second carrier each have a thermal conductivity;
wherein the thermal conductivity of the first carrier part of the second carrier is at least 1.5 times the thermal conductivity of the second carrier part of the second carrier;
wherein the first carrier is arranged on the second carrier; and
wherein the first carrier part of the first carrier is arranged above the first carrier part of the second carrier.

4. The light emitting diode device according to claim 1, wherein the first carrier has a first surface on which the light emitting diode chip is arranged, and a second surface opposite the first surface, wherein the first carrier part of the first carrier extends from the first surface to the second surface.

5. A light emitting diode device comprising:
a first carrier; and
a light-emitting diode chip arranged on the first carrier;
wherein the first carrier has a first carrier part and a second carrier part;
wherein the light emitting diode chip rests only on the first carrier part of the first carrier;
wherein the first and second carrier parts each have a thermal conductivity;
wherein the thermal conductivity of the first carrier part is at least 1.5 times the thermal conductivity of the second carrier part;
wherein the first carrier part is surrounded laterally by the second carrier part; and
wherein the first carrier part of the first carrier has thermal vias that extend from a first surface of the first carrier, on which the light emitting diode chip is arranged, to a second surface of the first carrier that is opposite the first surface.

6. The light emitting diode device according to claim 5, wherein the first carrier part of the first carrier has a metal block.

7. A light emitting diode device comprising:
a first carrier; and
a light-emitting diode chip arranged on the first carrier;
wherein the first carrier has a first carrier part and a second carrier part;
wherein the light emitting diode chip rests only on the first carrier part of the first carrier;
wherein the first and second carrier parts each have a thermal conductivity;
wherein the thermal conductivity of the first carrier part is at least 1.5 times the thermal conductivity of the second carrier part;
wherein the first carrier part is surrounded laterally by the second carrier part; and
wherein the first carrier part of the first carrier has dopings.

8. The light emitting diode device according to claim 7, wherein the light emitting diode device has a plurality of light emitting diode chips that are all arranged on the first carrier part.

9. A light emitting diode device comprising:
a first carrier; and
a light-emitting diode chip arranged on the first carrier;
wherein the first carrier has a first carrier part and a second carrier part;
wherein the light emitting diode chip rests only on the first carrier part of the first carrier;
wherein the first and second carrier parts each have a thermal conductivity;
wherein the thermal conductivity of the first carrier part is at least 1.5 times the thermal conductivity of the second carrier part;
wherein the first carrier part is surrounded laterally by the second carrier part; and
wherein the first carrier has an ESD protection element that comprises an element selected from the group consisting of a varistor, a silicon semiconductor protective diode and a polymer ESD protection element.

10. The light emitting diode device according to claim 9, wherein the ESD protection element is formed by a subregion of the first carrier.

11. A light emitting diode device comprising:
a first carrier;
a light-emitting diode chip arranged on the first carrier; and
an NTC thermistor component or a PTC thermistor component arranged on the first carrier;
wherein the first carrier has a first carrier part and a second carrier part;
wherein the light emitting diode chip rests only on the first carrier part of the first carrier;
wherein the first and second carrier parts each have a thermal conductivity;
wherein the thermal conductivity of the first carrier part is at least 1.5 times the thermal conductivity of the second carrier part;
wherein the first carrier part is surrounded laterally by the second carrier part.

12. The light emitting diode device according to claim 11, wherein the light emitting diode device has a plurality of light emitting diode chips that are all arranged on the first carrier part.

13. A light emitting diode device, comprising:
a first carrier;
a light emitting diode chip arranged on the first carrier; and
a second carrier, wherein the first carrier is arranged on the second carrier;
wherein the first carrier and the second carrier each have a first and a second carrier part;
wherein the light emitting diode chip rests only on the first carrier part of the first carrier;
wherein the first carrier parts and the second carrier parts each have a thermal conductivity;
wherein the first carrier part of the first carrier has a higher thermal conductivity than the second carrier part of the first carrier;
wherein the first carrier part of the second carrier has a higher thermal conductivity than the second carrier part of the second carrier;
wherein the first carrier part of the first carrier is arranged above the first carrier part of the second carrier;
wherein the first carrier part of the first carrier is surrounded laterally by the second carrier part of the first carrier;
wherein the first carrier part of the second carrier is surrounded laterally by the second carrier part of the second carrier; and
wherein the second carrier has an ESD protection element that comprises an element selected from the group consisting of a varistor, a silicon semiconductor protective diode and a polymer ESD protection element.

14. The light emitting diode device according to claim 13, wherein the ESD protection element is formed by a subregion of the second carrier.

15. A light emitting diode device, comprising:
a first carrier;
a light emitting diode chip arranged on the first carrier;
a second carrier, wherein the first carrier is arranged on the second carrier; and
an NTC thermistor component or a PTC thermistor component arranged on the second carrier;
wherein the first carrier and the second carrier each have a first and a second carrier part;
wherein the light emitting diode chip rests only on the first carrier part of the first carrier;
wherein the first carrier parts and the second carrier parts each have a thermal conductivity;
wherein the first carrier part of the first carrier has a higher thermal conductivity than the second carrier part of the first carrier;
wherein the first carrier part of the second carrier has a higher thermal conductivity than the second carrier part of the second carrier;
wherein the first carrier part of the first carrier is arranged above the first carrier part of the second carrier;
wherein the first carrier part of the first carrier is surrounded laterally by the second carrier part of the first carrier; and
wherein the first carrier part of the second carrier is surrounded laterally by the second carrier part of the second carrier.

16. The light emitting diode device according to claim 15, further comprising a second NTC thermistor component or second PTC thermistor component arranged on the first carrier.

17. The light emitting diode device according to claim 15, wherein the second carrier part of the first carrier or the second carrier part of the second carrier comprises a ceramic or an organic material.

18. The light emitting diode device according to claim 17, wherein the second carrier part of the first carrier comprises a ceramic or an organic material and wherein the second carrier part of the second carrier comprises a ceramic or an organic material.

19. A light emitting diode device, comprising:
a first carrier;
a light emitting diode chip arranged on the first carrier; and
a second carrier, wherein the first carrier is arranged on the second carrier;
wherein the first carrier and the second carrier each have a first and a second carrier part;
wherein the light emitting diode chip rests only on the first carrier part of the first carrier;
wherein the first carrier parts and the second carrier parts each have a thermal conductivity;
wherein the first carrier part of the first carrier has a higher thermal conductivity than the second carrier part of the first carrier;
wherein the first carrier part of the second carrier has a higher thermal conductivity than the second carrier part of the second carrier;
wherein the first carrier part of the first carrier is arranged above the first carrier part of the second carrier;
wherein the first carrier part of the first carrier is surrounded laterally by the second carrier part of the first carrier;
wherein the first carrier part of the second carrier is surrounded laterally by the second carrier part of the second carrier; and
wherein the second carrier part of the first carrier or the second carrier part of the second carrier comprise a metallic material and an electrically insulating layer.

20. The light emitting diode device according to claim 19, further comprising a third carrier, wherein the second carrier is arranged on the third carrier between the first carrier and the third carrier.

* * * * *